(12) United States Patent
Chen et al.

(10) Patent No.: US 6,380,030 B1
(45) Date of Patent: Apr. 30, 2002

(54) IMPLANT METHOD FOR FORMING $SI_3N_4$ SPACER

(75) Inventors: Sen-Fu Chen, Taipei; Ching-Wen Cho, Chu-San; Huan-Wen Wang; Chih-Heng Shen, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/298,448

(22) Filed: Apr. 23, 1999

(51) Int. Cl.⁷ ............................................. H01L 21/336
(52) U.S. Cl. ................... 438/257; 438/256; 438/258
(58) Field of Search .......................... 438/15, 257, 256, 438/258; 257/315, 316, 717, 900

(56) References Cited

U.S. PATENT DOCUMENTS

| | | | |
|---|---|---|---|
| 4,818,714 A | * 4/1989 | Haskell | 148/DIG. 106 |
| 5,597,751 A | 1/1997 | Wang | 437/43 |
| 5,714,412 A | 2/1998 | Liang et al. | 438/266 |
| 5,766,988 A | * 6/1998 | Cho | 438/159 |
| 5,789,296 A | 8/1998 | Sung et al. | 438/266 |
| 5,811,853 A | 9/1998 | Wang | 257/316 |
| 5,858,840 A | * 1/1999 | Hsieh | 438/266 |
| 5,872,036 A | * 2/1999 | Sheu | 438/266 |
| 5,909,622 A | * 6/1999 | Kadosh et al. | 438/286 |
| 5,970,371 A | * 10/1999 | Hsieh | 438/593 |
| 6,001,690 A | * 12/1999 | Chien | 438/266 |
| 6,031,264 A | * 2/2000 | Chien | 257/315 |
| 6,140,182 A | * 10/2000 | Chen | 438/259 |
| 6,165,845 A | * 12/2000 | Hsieh | 438/260 |
| 6,166,405 A | * 12/2000 | Kuriyama | 257/290 |
| 6,184,088 B1 | * 2/2001 | Kurooka et al. | 438/264 |
| 6,187,657 B1 | * 2/2001 | Xiang et al. | 438/573 |

* cited by examiner

*Primary Examiner*—Olik Chaudhuri
*Assistant Examiner*—Nathan W. Ha
(74) *Attorney, Agent, or Firm*—George O. Saile; Stephen B. Ackerman; Sergin Oktay

(57) ABSTRACT

A method is disclosed to form a reliable silicon nitride spacer between the lower edges of the floating gate and the control gate of a split-gate flash memory cell. This is accomplished by forming a floating gate with vertical sidewalls, forming a high temperature oxide layer followed by silicon nitride layer over the floating gate including the vertical sidewalls, ion implanting the nitride layer and then selectively etching it to form a robust silicon nitride spacer of well defined rectangular shape.

15 Claims, 4 Drawing Sheets

FIG. 1 – Prior Art

IMPLANT METHOD FOR FORMING SI₃N₄ SPACER

BACKGROUND OF THE INVENTION

(1) Field of the Invention

The present invention relates to split-gate memory cells used in flash EEPROMs (Electrically Erasable Programmable Read Only Memories), and in particular, to a method of forming a better controlled silicon nitride, $Si_3N_4$, spacer through a judicious ion implantation of nitride layer over the floating gate of a split-gate flash memory cell.

(2) Description of the Related Art

A spacer formed between the lower edges of the floating gate and the control gate of a split-gate flash memory cell will enhance the endurance (the number of times the cell can be written and erased) of the cell provided that the spacer is well defined, or shaped, and well formed. In current practice, the spacer is formed by overetching, which in turn makes it difficult to control the shape and size of the spacer as is described more in detail below. Consequently, the endurance is degraded as well as the erase and program (writing) speed of the cell. A poorly defined spacer will also cause, what is known in the art as "write disturb", or, unwanted reverse tunneling, or erasing. It is disclosed in the embodiments of the present invention a method of forming reliable nitride spacers in split-gate flash memory cells.

Most conventional flash-EEPROM cells use a double-polysilicon (poly) structure of which the well known split-gate cell is shown in FIG. 1. There, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1, control gate (60) overlaps the channel region, (17), adjacent to channel (15) under the floating gate, (40). It will be known to those skilled in the art that this structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance.

To program the transistor shown in FIG. 1 which shows the placement of gate, source and drain voltages or Vg, $V_s$ and $V_d$, respectively, charge is transferred from substrate (10) through gate oxide (30) and is stored on floating gate (40) of the transistor. The amount of charge is set to one of two levels to indicate whether the cell has been programmed "on" or "off." "Reading" of the cell's state is accomplished by applying appropriate voltages to the cell source (11) and drain (13), and to control gate (60), and then sensing the amount of charge on floating gate (40). To erase the contents of the cell, the programming process is reversed, namely, charges are removed from the floating gate by transferring them back to the substrate through the gate oxide. Electron tunneling occurs through oxide regions (33) and (53) shown in FIG. 1.

This programming and erasing of an EEPROM is accomplished electrically and in-circuit by using Fowler-Nordheim (F-N) tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Inadvertent reverse tunneling, or erasure, for example, may occur if the tunnel oxide is degraded, or the spacer formed between the floating gate and the control gate is poorly shaped.

In prior art, spacers are employed for various purposes. Wang in U.S. Pat. Nos. 5,811,853 and 5,597,751 forms a thick spacer oxide layer on top of a floating gate and the source/drain region of a substrate to prevent shorting thereinbetween in a memory cell. In U.S. Pat. No. 5,789,296, Sung teaches a method of forming a split-gate flash memory by preparing a substrate having an oxide layer; forming a first conduction layer over the oxide layer; etching a portion of the first conducting layer to form a word line structure for the flash memory; forming a spacer layer over the word line structure to be a side-wall portion of a word-line protecting layer; oxidizing the word-line protecting layer to form a dielectric layer, and forming a floating gate layer over the dielectric layer.

In another approach, Liang, et al., in U.S. Pat. No. 5,714,412 disclose a multi-level, split-gate flash memory cell where the memory device is formed on a doped semiconductor substrate, and covered with a tunnel oxide layer covering turn with a doped first polysilicon layer. The first polysilicon layer is patterned into a pair of floating gate electrodes. An interelectrode dielectric layer covers the floating gate electrodes, the sidewalls of the floating gate electrodes and the edges of the tunnel oxide below the floating gate electrodes. A second polysilicon layer overlying the interelectrode dielectric layer and is in turn covered by a tungsten silicide layer. A control gate electrode which spans the pair of floating gate electrodes is formed by the second polysilicon layer, the tungsten silicide and the first and second dielectric layers patterned into a gate electrode stack providing a control gate electrode spanning across the pair of floating gate electrodes.

It is disclosed in the present invention a different method of forming a spacer in a split-gate flash memory cell by judiciously implanting the layer from which the spacer is formed.

SUMMARY OF THE INVENTION

It is therefore an object of this invention to provide method of forming a split-gate flash memory cell having a well shaped and well formed spacer between the lower edges of the floating gate and the control gate of the cell.

It is another object of this invention to provide a method of forming a nitride spacer through a judicious ion implanting of the nitride layer from which it is formed.

It is still another object of the present invention to provide split-gate flash memory cell having a rectangular shaped spacer between the lower edges of the floating gate and the control gate of the cell.

These objects are accomplished by providing a silicon substrate having a plurality of active and field regions defined; forming a gate oxide layer over said substrate; forming a first polysilicon layer over said gate oxide forming a first polysilicon layer over said gate oxide layer; forming a nitride layer over said first polysilicon layer; forming and patterning a first photoresist layer over said first polysilicon layer to form a photoresist mask with a pattern corresponding to the floating gate of said split-gate flash memory cell; etching said nitride layer through said photoresist mask to form an opening to expose a portion of the underlying said first polysilicon layer; removing said first photoresist layer; oxidizing said fist polysilicon layer exposed in said opening thus forming poly oxide over said first polysilicon layer; removing said nitride layer; using said poly oxide as a hard mask, etching said first polysilicon layer to form floating gate; forming high temperature oxide (HTO) layer over said substrate including said floating gate; forming silicon nitride layer over said HTO layer; vertical implanting said silicon nitride layer covering said substrate; performing a high selectivity etch of said silicon nitride layer to form silicon nitride spacer; forming an intergate oxide layer over said substrate; forming a second polysilicon layer over said intergate oxide layer; and patterning said second polysilicon layer with a second photoresist mask having control gate pattern to form a control gate to complete the forming of said split-gate flash memory cell.

These objects are further accomplished by providing a split-gate flash memory cell having a floating gate with vertical walls and a rectangular nitride spacer between the lower edges of the floating gate and the control gate of the memory cell.

BRIEF DESCRIPTION OF THE DRAWINGS

FIG. 1 is a cross-sectional view of a portion of a semiconductor substrate showing a split-gate flash memory cell of prior art.

FIG. 2ee is a cross-sectional view of a portion of a semiconductor substrate showing the preferred embodiment of the present invention where the HTO layer is subjected to ion implantation, according to this invention.

FIG. 2ff is a cross-sectional view of a portion of a semiconductor substrate showing the preferred embodiment of the present invention where the HTO+WOX layer is selectively etched to form the $Si_3N_4$ spacer, according to this invention.

FIG. 2gg is a cross-sectional view of a portion of a semiconductor substrate showing the preferred embodiment of the split-gate flash memory cell of this invention where a well shaped $Si_3N_4$ spacer is formed, according to this invention.

DESCRIPTION OF THE PREFERRED EMBODIMENTS

Figure 2A:
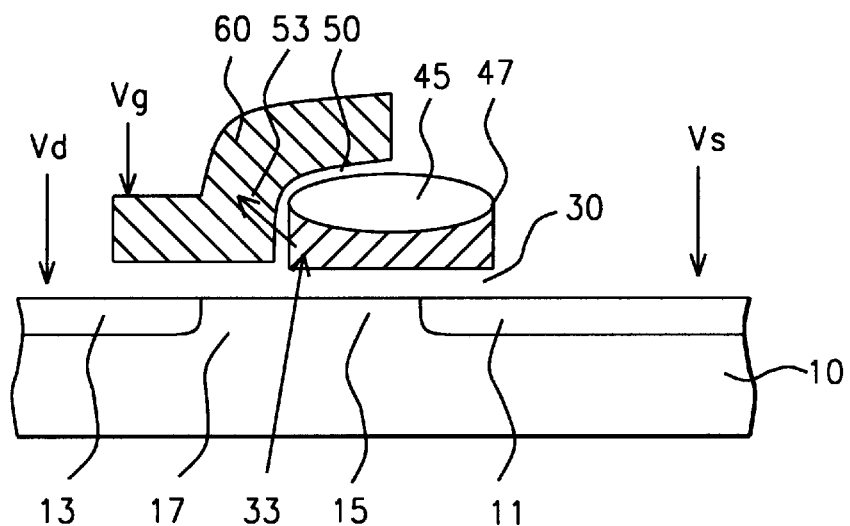
FIG. 2a is a cross-sectional view of a portion of a semiconductor substrate showing the patterning of a first photoresist layer formed over a layer of nitride overlying first polysilicon layer which in turn is formed over the gate oxide layer, according to this invention.

Referring now to the drawings, in particular to FIGS. 2a–2e and FIGS. 2ee–2hh, there is shown steps of forming a spacer for a split-gate flash memory cell by ion implanting the silicon nitride layer from which the spacer is formed. FIGS. 2e–2h show the current manufacturing practice where no implantation is employed. It will be apparent to those implantation is employed. It will be apparent to those skilled in the art that the preferred method of ion implantation of the nitride layer as disclosed in FIGS. 2ee–2hh makes it possible to achieve the well defined and shaped nitride spacer which in turn enhances the endurance of the split-gate flash memory cell of this invention.

In FIG. 2a, gate oxide layer (120) is formed over substrate (100), preferably silicon. Gate oxide (120) can be formed by thermal oxidation process at a temperature between about 850 to 1000° C. Alternatively, the gate oxide can be formed by an atmospheric or low pressure chemical vapor deposition (LPCVD) process as is well known. Gate oxide layer (120) has a thickness between about 90 to 110 angstroms (Å).

Figure 2B:
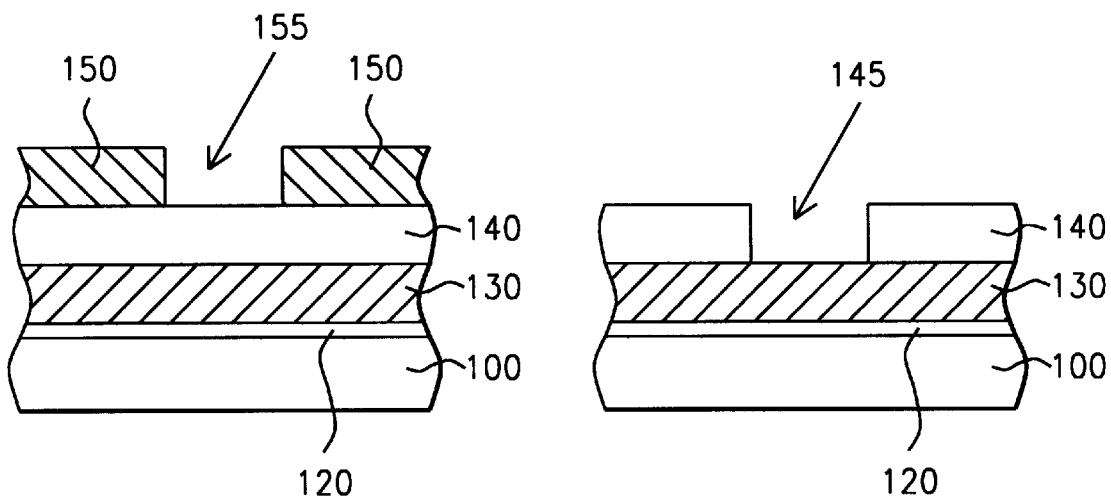
FIG. 2b is a cross-sectional view of a portion of a semiconductor substrate showing the forming of an opening in the nitride layer of FIG. 2a and exposing portion of the first polysilicon layer, according to this invention.

Next, first polysilicon layer (130) is formed over the gate oxide layer through reduction of $SiH_4$ using LPCVD at a temperature between about 500 to 800° C. The preferred thickness of the first layer of polysilicon is between about 1400 to 1600 Å. This is followed by forming nitride layer (140) shown in FIG. 2a by reacting dichlorosilane ($SiCl_2H_2$) with ammonia ($NH_3$) in an LPCVD at a temperature between about 700 to 900° C. The preferred thickness of the nitride layer is between about 1400 to 1600 Å. A photoresist mask (150) having patterns (155) is next formed over the nitride layer to a thickness between about 8000 to 12000 Å corresponding to areas where floating gates are to be defined also as shown in FIG. 2a. The patterns are then etched into nitride layer (140) forming openings (145) where portion of the underlying first polysilicon layer (130) is exposed as shown in FIG. 2b. It is preferred that the etching of nitride layer (140) is accomplished with a recipe comprising gases $CF_4$ and $CHF_3$. Afterwards, the photoresist layer is removed by oxygen plasma ashing.

Figures 2C, 2D:
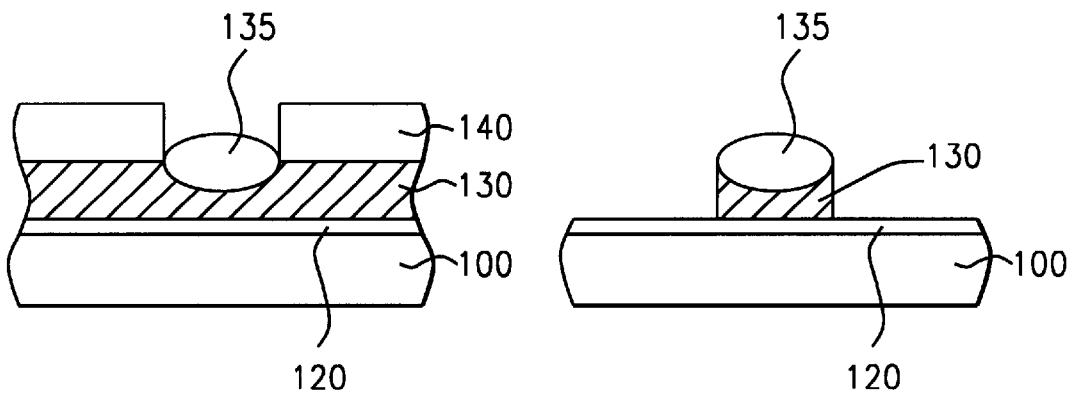
FIG. 2c is a cross-sectional view of a portion of a semiconductor substrate showing the forming of polyoxide over the exposed portion of the first polysilicon layer of FIG. 2b, according to this invention.
FIG. 2d is a cross-sectional view of a portion of a semiconductor substrate showing the forming of the floating gate of this invention with vertical sidewall.

Next, first polysilicon layer (130) that is exposed in the pattern openings (145) in the nitride layer is oxidized to form polyoxide (135) as shown in FIG. 2c. Subsequently, the nitride layer is removed where now polyoxide (135) serves as a hard mask to remove all the first polysilicon portions except those that are covered by the overlying polyoxide layer as shown in FIG. 2d. It is important that the sidewall of the floating gate so formed has vertical wall and that the etching of the polysilicon is accomplished with a recipe comprising $Cl_2$ and HBr.

Figures 2E, 2F:
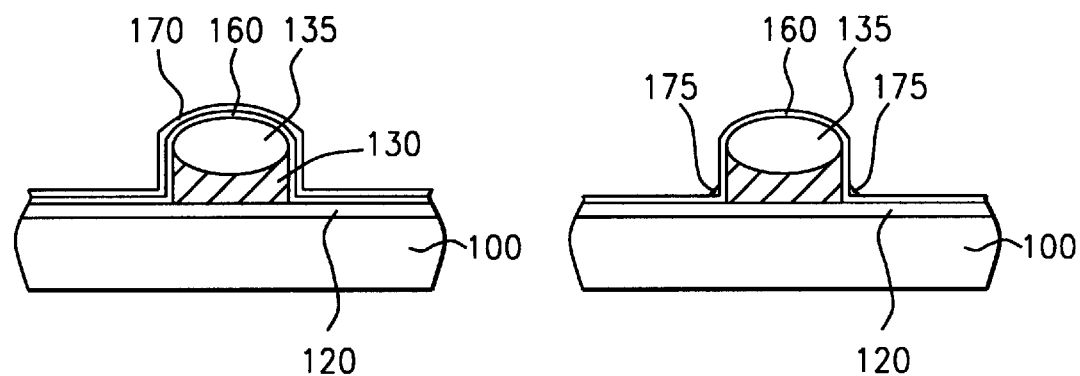
FIG. 2e is a cross-sectional view of a portion of a semiconductor substrate showing the forming of a high temperature oxide (HTO) layer followed silicon nitride layer on the vertical sidewall of the floating gate of this invention.
FIG. 2f is a cross-sectional view of a portion of a semiconductor substrate showing the forming of the nitride spacers as currently practiced in the manufacturing line.

Then, a high-temperature oxide (HTO) layer (160) is formed over the substrate, including the vertical sidewall of floating gate (130) as shown in FIG. 2e. It is important that a wet oxide (WOX)layer is also grown over the HTO to form (HTO+WOX) in an $H_2O+O_2$ environment at a temperature between about 970 to 990° C. It is preferred that the total thickness of the thick oxide (HTO+WOX) is between about 190 to 210 Å. As a key aspect of the present invention, this is followed by forming another thick layer (170), this time silicon nitride $Si_3N_4$, over the (HTO+WOX) layer as shown in FIG. 2e. $Si_3N_4$ is formed by reacting dichlorosilane $SiH_2Cl_2$ with ammonia $NH_3$ in an LPCVD at a pressure between about 0.4 to 0.6 torr, temperature between about 700 to 900° C. and at flow rates between about 500 to 600 sccm. It is preferred that the thickness of the silicon nitride layer is also between about 190 to 210 Å.

Figure 2G:
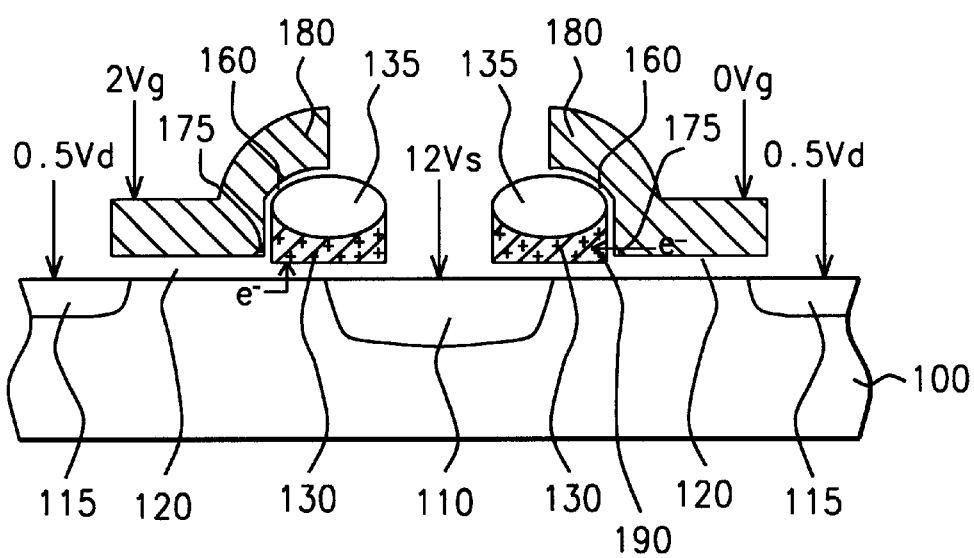
FIG. 2g is a cross-sectional view of a portion of a semiconductor substrate showing the forming of a split-gate flash memory cell as currently practiced in the manufacturing line.
Figure 2E:
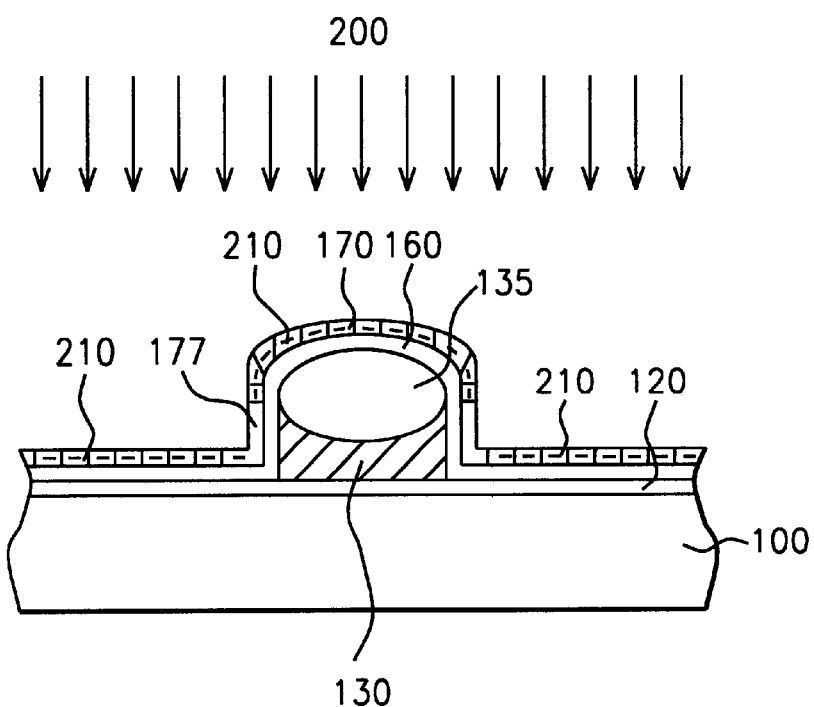
Figure 2F:
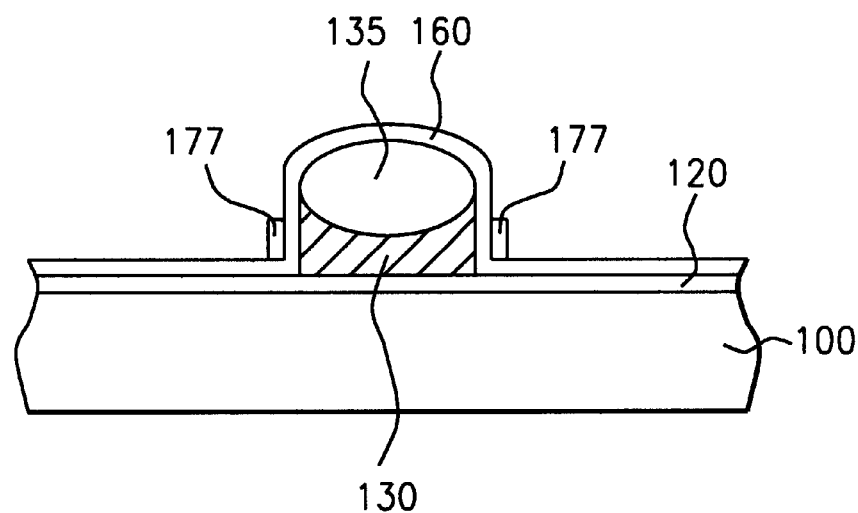
Figure 2G:
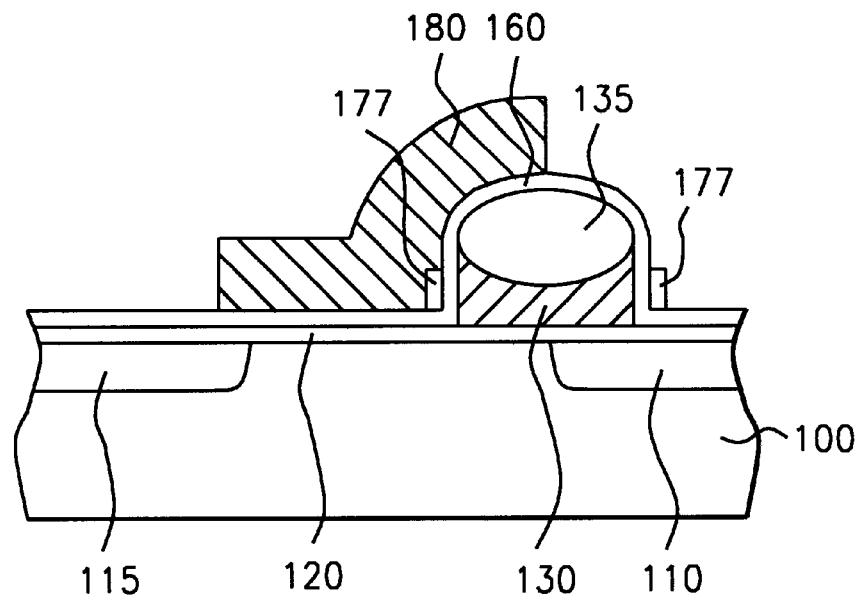

Normally, the next step involves the anisotropic etching of nitride layer (170) to form nitride spacer (175) shown in FIG. 2f. Then an intergate or interpoly oxide between the formed floating gate (130) shown in FIG. 2f, and the control gate (180) to be formed subsequently as shown in FIG. 2g. Subsequently, a second polysilicon layer is deposited to form a control gate as shown in the same FIG. 2g. This completes the forming of a split-gate flash memory cell as it is presently practiced in the manufacturing line. However, with this current method, it has been the experience of the present manufacturing line that it is very difficult to form sustainable nitride spacers with the over etch technique that is used. The resulting spacers are usually small and fragile as shown in FIG. 2f. Because of the fragility of the spacer formed on the vertical wall of the floating gate, the spacer as well as the adjacent interpoly oxide become degraded. As a result, during programming, "write disturb", as is commonly known, occurs in the following way: each time flash cells are to be programmed to an "0" state, the word line (formed over the respective control gate) for those cells are selected as shown in FIG. 2g. Here, the selected cell on the left side in FIG. 2g is shown with a gate voltage $V_g$ of 2.0 volts, drain (115) voltage Vd of 0.5 volts while the common source (110) has a Vs voltage of 12 volts. However, cells that are not to be programmed to "0" state must be unselected so that channel hot electrons are not injected into the floating gate. This is shown on the right side of FIG. 2g where the $V_g$ is 0 volts. With poor or degraded spacer such as (175) shown in FIG. 2g, however, it is found that the unselected cell with $0V_g$ experiences reverse tunneling as shown by arrow (190) in FIG. 2g. In other words, the well-known programming "write disturb" occurs due to the unsatisfactory barrier to reverse tunneling provided by the ineffective silicon nitride spacer (175) of the present manufacturing line. Furthermore, the degraded oxide and nitride spacer contribute to the unacceptably low endurance levels as well.

As a preferred embodiment and a main feature of the present invention, therefore, nitride layer (170) of FIG. 2e is subjected to ion implantation as shown in FIG. 2ee. It is important that the implantation is vertical so that only the surfaces normal to the path of the implanting ion species (200) are implanted. In other words, while surfaces (210) in FIG. 2ee are implanted, the vertical silicon nitride walls, (177), do not provide a viewing factor to the incoming ions. It has been found that by varying the dosage level of implantation, the etch rate of implanted silicon nitride layer can also be varied. This is shown in the table below in the case of implanting boron (B) or boron fluoride ($BF_2$) at a dosage level between about $10^{13}$ to $10^{16}$ atoms/cm$^2$ into $Si_3N_4$ at energy level between about 20 to 40 KEV:

TABLE I

| Etch rate (Å/min) | as-deposited $Si_3N_4$ | implanted $Si_3N_4$ |
|---|---|---|
| Anisotropic rate | 325 | 380 |
| Isotropic rate | 190 | 187 |
| Aniso/iso | 1.76 | 2.02 |

Thus, using a high selectivity etch recipe comprising $SF_6$, HBr and $O_2$, the implanted portions (210) of nitride layer (170) are etched at a much faster rate than the as-deposited portions (177) on the vertical sidewall of the floating gate (130) shown in FIG. 2ee. Consequently, a well defined spacer (177) with a rectangular shape is formed as shown in FIG. 2ff. It will be appreciated that the integrity, that is the shape, thickness and height of spacer (177) would be compromised if the nitride wall deviated from the vertical. The preferred width and height of spacer (177) shown in FIG. 2ff are between about 50 to 100 Å, and 200 to 800 Å, respectively.

After having formed the nitride spacer, (177), of this invention, the completion of the split-gate is accomplished by first blanket depositing (not shown) over the substrate a second polysilicon layer (180) and patterning it to form control gate as shown in FIG. 2gg. It is preferred that the second layer of polysilicon is formed using silicon source $SiH_4$ in an LPCVD chamber at a temperature between about 610 to 630° C., and that it has a thickness between about 1400 to 1600 Å.

Thus, in the programming of the split-gate flash cell shown in FIG. 2gg, the $Si_3N_4$ spacer (177) of this invention provides the necessary robustness not to degrade the endurance of the cell. The nitride spacer is formed along the vertical sidewall of a floating gate. The preferred implant method also improves the manufacturability by providing a better etch control in the forming of the nitride spacer.

While the invention has been particularly shown and described with reference to the preferred embodiments thereof, it will be understood by those skilled in the art that various changes in form and details may be made without departing from the spirit and scope of the invention.

What is claimed is:

1. A method of forming nitride spacers in split-gate flash memory cells employing ion implantation, comprising the steps of:

providing a substrate having a plurality of active and field regions defined;

forming a gate oxide layer over said substrate;

forming a first polysilicon layer over said gate oxide layer;

etching said first polysilicon layer to define floating gate structure of said split-gate flash memory cells;

forming an oxide layer over said substrate including said floating gate;

forming a nitride layer over said oxide layer;

vertically ion implanting said nitride layer;

performing a high selectivity etch of said nitride layer to form spacers on the sidewalls of said floating gate;

forming an intergate dielectric layer over said substrate;

forming a second polysilicon layer over said intergate dielectric layer; and patterning said second polysilicon layer to form control gate structure of said split-gate flash memory cells.

2. The method of claim 1, wherein said forming said gate oxide layer is accomplished by thermal growth at a temperature between about 850 to 1000° C.

3. The method of claim 1, wherein said gate oxide layer has a thickness between about 90 to 110 Å.

4. The method of claim 1, wherein said forming said first polysilicon layer is accomplished with silicon source $SiH_4$ using LPCVD at a temperature between about 500 to 800° C.

5. The method of claim 1, wherein said first polysilicon layer has a thickness be we about 1400 to 1600 Å.

6. The method of claim 1, wherein said etching said first polysilicon layer to define floating gate is accomplished with a recipe comprising $Cl_2$ and HBr.

7. The method of claim 1, wherein said oxide layer comprises hot temperature oxide (HTO) formed at a temperature between about 500 to 700° C.

8. The method of claim 1, wherein said oxide layer comprises hot temperature oxide (HTO) formed at a temperature between about 500 to 700° C.

9. The method of claim 1, said forming said nitride layer is accomplished with LPCVD at a temperature between about 700 to 900° C. by reacting dichlorosilane ($SiCl_2H_2$) with ammonia ($NH_3$).

10. The method of claim 1, wherein said nitride layer has a thickness between about 170 to 250 Å.

11. The method of claim 1, wherein said vertical ion implanting is accomplished with B or $BF_2$ at a dosage level between about $10^{13}$ to $10^{16}$ atoms/cm$^2$ and energy between about 20 to 40 KEV.

12. The method of claim 1, wherein said performing said high selectivity nitride etch to form said spacers is accomplished with a recipe comprising $SF_6$, $O_2$ and HBr.

13. The method of claim 1, wherein said forming said intergate dielectric layer is accomplished by thermal growth at a temperature between about 800 to 860° C.

14. The method of claim 1, wherein said forming said second polysilicon layer over aid intergate dielectric layer is accomplished with silicon source $SiH_4$ using LPCVD at a temperature between about 610 to 630° C.

15. The method of claim 1, wherein said second polysilicon layer has a thickness between about 1400 to 1600 Å.

* * * * *

UNITED STATES PATENT AND TRADEMARK OFFICE
CERTIFICATE OF CORRECTION

PATENT NO. : 6,380,030 B1 Page 1 of 1
DATED : April 30, 2002
INVENTOR(S) : Sen-Fu Chen, Ching-Wen Cho, Huan-Wen Wang and Chih-Heng Shen It is certified that error appears in the above-identified patent and that said Letters Patent is hereby corrected as shown below:

<u>Title page,</u>
Item [74], please delete "Sergin Oktay", and replace it with -- Sevgin Oktay --.

Signed and Sealed this

Third Day of December, 2002

*JAMES E. ROGAN*
*Director of the United States Patent and Trademark Office*